US010321603B1

(12) United States Patent
Banerjee et al.

(10) Patent No.: US 10,321,603 B1
(45) Date of Patent: Jun. 11, 2019

(54) ELECTRICAL POWER DISTRIBUTION FOR IMMERSION COOLED INFORMATION SYSTEMS

(71) Applicant: TAS Energy, Inc., Houston, TX (US)

(72) Inventors: Abhishek Banerjee, Houston, TX (US); Jon Benson, Houston, TX (US)

( * ) Notice: Subject to any disclaimer, the term of this patent is extended or adjusted under 35 U.S.C. 154(b) by 0 days.

(21) Appl. No.: 16/042,306

(22) Filed: Jul. 23, 2018

(51) Int. Cl.
*H05K 7/20* (2006.01)
*G06F 1/20* (2006.01)

(52) U.S. Cl.
CPC ........... *H05K 7/20236* (2013.01); *G06F 1/20* (2013.01); *H05K 7/20318* (2013.01); *H05K 7/20327* (2013.01)

(58) Field of Classification Search
CPC ........... H05K 7/20236; H05K 7/20318; H05K 7/20327; G06F 1/20
See application file for complete search history.

(56) References Cited

U.S. PATENT DOCUMENTS

| | | | | |
|---|---|---|---|---|
| 3,129,991 | A | 4/1964 | Schmitz | |
| 3,728,585 | A * | 4/1973 | Olashaw | F28D 15/0266 165/104.26 |
| 3,999,105 | A | 12/1976 | Archey et al. | |
| 4,487,466 | A | 12/1984 | Petit | |
| 4,679,123 | A | 7/1987 | Young | |
| 5,297,621 | A | 3/1994 | Taraci et al. | |
| 6,019,167 | A | 2/2000 | Bishop et al. | |
| 8,014,150 | B2 | 9/2011 | Campbell et al. | |
| 9,713,290 | B2 | 7/2017 | James et al. | |
| 9,921,622 | B2 | 3/2018 | Shelnutt et al. | |
| 2004/0223311 | A1 | 11/2004 | Lee | |
| 2005/0076479 | A1 | 4/2005 | Rolla | |
| 2006/0090881 | A1 | 5/2006 | Tuma | |
| 2008/0180917 | A1 | 7/2008 | Lawrence | |
| 2008/0196868 | A1 | 8/2008 | Attlesey et al. | |
| 2010/0302715 | A1 * | 12/2010 | Bortoli | H01H 9/52 361/676 |
| 2015/0047372 | A1 * | 2/2015 | Kaufmann | H01H 9/52 62/62 |
| 2015/0060009 | A1 * | 3/2015 | Shelnutt | F28F 27/02 165/11.1 |
| 2017/0117103 | A1 * | 4/2017 | Kennelly | H01H 9/52 |

OTHER PUBLICATIONS

Phillip E. Tuma, "Design Considerations Relating to Non-Thermal Aspects of Passive 2-Phase Immersion Cooling", 27th IEEE Semi-Therm Symposium (2011), 9 pages.

(Continued)

*Primary Examiner* — Steven T Sawyer

(74) *Attorney, Agent, or Firm* — Pierre Campanac; Porter Hedges LLP

(57) ABSTRACT

A system for two-phase immersion cooling includes an immersion tank, and a plurality of busbars, each busbar extending through a wall of the immersion tank. The system also includes a plurality of voltage converters mounted on a skid, on which the immersion tank can also be mounted. The system preferably includes means for preventing leakage of dielectric fluid around the busbars and means for connecting each busbar plate to the modular cases holding circuit boards that can be inserted into the immersion tank.

16 Claims, 9 Drawing Sheets

(56) References Cited

OTHER PUBLICATIONS

3M Novec 649 Engineered Fluid, 3M Electronics Markets Materials Division (Sep. 2009), 4 pages.
3M Novec Engineered Fluids—Two-Phase Immersion Cooling, 3M Electronics Materials Solutions Division (2015), 4 pages.
3M Thermal Management Fluids, 3M Electronics Markets Materials Division (Sep. 2009), 8 pages.
Phil E. Tuma, "Passive 2-Phase Immersion Cooling (P2PIC) of Bitcoin Hardware and Implications for other Computing Applications", 3M Market Solutions Division, Presentation at iMAPs ATW (2015), 18 pages.
3M Two-Phase Immersion Cooling—High Level Best Practices for System Fabrication*, Technical Paper, (2014), 4 pages.
2-Phase Immersion Cooling (2PIC) With High Performance Heat Transfer, Wieland Thermal Solutions; URL: http://www.wieland-thermalsolutions.com/internet/en/applications/refrigeration_technology/immersion_cooling/t03_inhaltsseite_21.jsp.

* cited by examiner 12
26
32
14
60
24

ELECTRICAL POWER DISTRIBUTION FOR IMMERSION COOLED INFORMATION SYSTEMS

CROSS-REFERENCE TO RELATED APPLICATIONS

None

BACKGROUND

This disclosure generally relates to methods and apparatus for cooling electric or electronic components using one or more dielectric heat transfer fluids and, more specifically, to methods and apparatus for distributing electrical power into an immersion tank.

Conventional electronic components are designed to operate over a specified temperature range with upper limits generally below 70 deg. C. for commercial grade, 85 deg. C. for industrial grade, or 125 deg. C. for military grade; therefore, these components may require cooling such that their internal temperature remains below these upper limits. The cooling can be performed, among other ways, by the vaporization of a dielectric heat transfer fluid, such as perfluorocarbons, fluoroketones, or hydrofluoroethers. Depending on its composition, the dielectric heat transfer fluid may have a boiling temperature at atmospheric pressure that may range from approximately 35 deg. C. to approximately 100 deg. C., such that the boiling temperature at atmospheric pressure is lower than the upper limits at which conventional electronic components are designed to operate. The electronic components are immersed in the dielectric heat transfer fluid in liquid phase. When the surfaces of electronic components in contact with the dielectric heat transfer fluid reach the boiling temperature of the dielectric heat transfer fluid, the dielectric heat transfer fluid located nearby will vaporize, therefore absorbing heat from the electronic components.

Known two-phase cooling systems are described in U.S. Pat. Appl. Pub. No. 2014/0218858. In such a system, the power distribution unit is located inside the immersion cooling tanks, and below a surface level of the dielectric fluid in the liquid phase. The power distribution unit is coupled via a power cable to the external power source located on the outside of the immersion cooling tank.

With the advancement of High-Performance Computing, where large numbers of computers are assembled or collocated into a unit or data center for simulation or encryption computing, there is a continuing need in the art to accommodate for larger densities and amounts of electronic components to be cooled. Thus, there is a continuing need in the art for improved two-phase immersion cooling systems and methods, where the power distribution unit is preferably located outside of the immersion tank.

BRIEF SUMMARY OF THE DISCLOSURE

The disclosure describes a system for two-phase immersion cooling.

The system may comprise an immersion tank. The immersion tank may include a container for holding a bath of dielectric heat transfer fluid in liquid phase. The immersion tank may also include at least one condenser for condensing dielectric heat transfer fluid from a vapor phase to a liquid phase.

The system may comprise a plurality of voltage converters mounted on a skid, on which the immersion tank may also be mounted. The voltage converters may be designed for converting a high voltage, low amperage current into a low voltage, high amperage current. The voltage converters may preferably be mounted outside the immersion tank.

The system may comprise a plurality of circuit boards. For example, the circuit boards may be programmed for blockchain mining operation. The circuit boards may be sized to be at least partially lowered into the container for holding the bath of dielectric heat transfer fluid in liquid phase.

The system may comprise a plurality of busbars. The busbars may extend through a wall of the immersion tank. For example, the busbars may include an inner portion extending inside the immersion tank, and an outer portion extending outside the immersion tank. Each busbar may be electrically connected to at least one voltage converter. Each busbar may also be electrically connected to at least one circuit board. The busbars may be essentially made of copper, aluminum, or a combination of copper and aluminum. The busbars may be at least partially plated. The busbars may preferably be distributed over a horizontal direction of the wall of the immersion tank.

The system may comprise modular cases holding the circuit boards. The modular cases may be sized to be at least partially lowered into the container for holding the bath of dielectric heat transfer fluid in liquid phase. The system may comprise means for connecting the busbars to connectors plates secured to the modular cases.

In some embodiments, the inner portion of the busbars may comprise one or more busbar plates. The busbar plates may have a notch extending downward from an upper outer surface of the busbar plates. Two or more connector plates may be secured to the modular cases. The connector plates may be spaced such that each busbar plate is capable of sliding between two connector plates. A bolt may traverse the connector plates. The bolt may be sized to slide into the notches of the bar plates. A load distribution plate may be traversed by the bolt. A nut may be threaded on an end portion of the bolt. A plurality of sockets may be electrically connected to the connector plates. Conversely, the inner portion may comprise two or more busbar plates. A bolt may traverse the busbar plates. A load distribution plate may be traversed by the bolt. A nut may be threaded on an end portion of the bolt. One or more connector plates may be secured to the modular cases. The connector plates may be sized such that each connector plate is capable of sliding between two busbar plates. The connector plates may have a notch extending upward from a lower outer surface of the connector plates. The bolt may be sized to slide into the notches of the connector plates. Again, a plurality of sockets may be electrically connected to the connector plates.

In some embodiments, one or more apertures may traverse through the wall of the immersion tank. Between 5 and 10 apertures may traverse through the wall of the immersion tank. The busbars may extend through one aperture. The busbars extending through one aperture may be designed to carry between 1,000 and 4,200 Amperes, and preferably between 2,100 and 4,200 Amperes. The system may further comprise means for preventing leakage of dielectric fluid around the busbars, such as one or more sealing lids. Each of the one or more sealing lids may cover at least one aperture. The busbars may extend through the sealing lids.

The sealing lids may comprise a body made of fiberglass reinforced plastic. The body may have a first face and a second face essentially parallel to the first face. The body may include one or more body apertures. The busbars may extend through the body apertures. The body apertures may be potted with a resin-based polymer. The sealing lids may comprise a metallic frame. The metallic frame may be disposed along a boundary of the first face of the body. The sealing lids may comprise a plurality of bolts. The bolts may be located in holes traversing the body and the metallic frame. The holes may be potted with a resin-based polymer. The sealing lids may comprise a sealing gasket. The sealing gasket may be disposed along a boundary of the second face. The sealing gasket may further surround the bolts and the body apertures.

BRIEF DESCRIPTION OF THE DRAWINGS

For a more detailed description of the embodiments of the disclosure, reference will now be made to the accompanying drawings, wherein.

DETAILED DESCRIPTION

Figure 1:
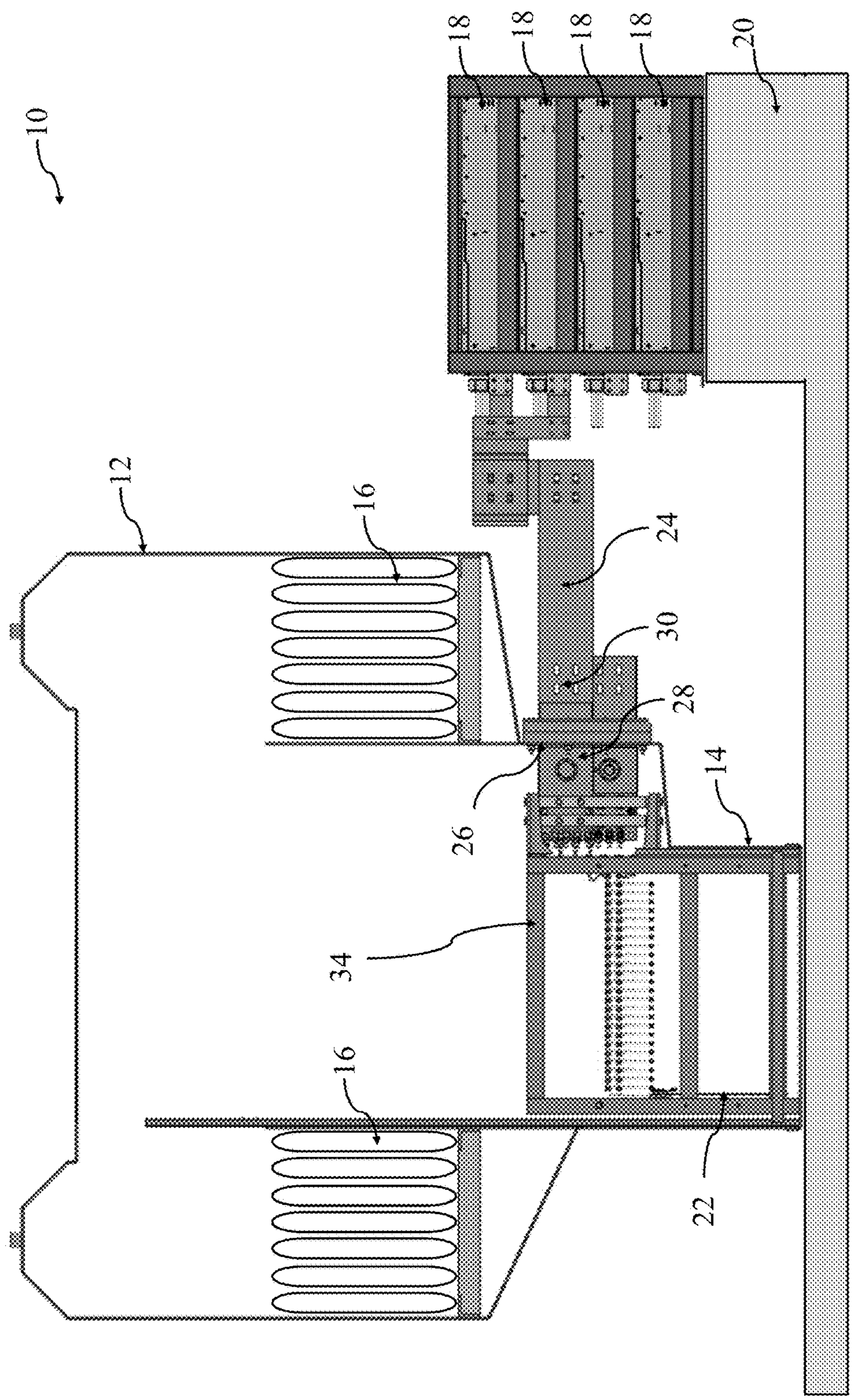
FIG. 1 is a sectional view of a system for two-phase immersion cooling illustrating an immersion tank, voltage converters mounted outside the immersion tank, and a plurality of busbars connected to at least one voltage converter and to at least one circuit board.

It is to be understood that the following disclosure describes several exemplary embodiments for implementing different features, structures, or functions of the invention. Exemplary embodiments of components, arrangements, and configurations are described below to simplify the disclosure; however, these exemplary embodiments are provided merely as examples and are not intended to limit the scope of the invention. Additionally, the disclosure may repeat reference numerals and/or letters in the various exemplary embodiments and across the Figures provided herein. This repetition is for the purpose of simplicity and clarity and does not in itself dictate a relationship between the various exemplary embodiments and/or configurations discussed in the various Figures. Finally, the exemplary embodiments presented below may be combined in any combination of ways, i.e., any element from one exemplary embodiment may be used in any other exemplary embodiment, without departing from the scope of the disclosure.

All numerical values in this disclosure may be exact or approximate values unless otherwise specifically stated. Accordingly, various embodiments of the disclosure may deviate from the numbers, values, and ranges disclosed herein without departing from the intended scope. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

In the following discussion and in the claims, the terms "including" and "comprising" are used in an open-ended fashion, and thus should be interpreted to mean "including, but not limited to." Furthermore, as it is used in the claims or specification, the term "or" is intended to encompass both exclusive and inclusive cases, i.e., "A or B" is intended to be synonymous with "at least one of A and B," unless otherwise expressly specified herein.

Certain terms are throughout the following description and claims refer to particular components. As one having ordinary skill in the art will appreciate, various entities may refer to the same component by different names, and as such, the naming convention for the elements described herein is not intended to limit the scope of the invention, unless otherwise specifically defined herein. Further, the naming convention used herein is not intended to distinguish between components that differ in name but not function.

FIG. 1 illustrates a system 10 for two-phase immersion cooling. Accordingly, the system 10 comprises an immersion tank 12. The immersion tank 12 includes a container 14 for holding a bath of dielectric heat transfer fluid in liquid phase, and at least one condenser 16 for condensing dielectric heat transfer fluid from a vapor phase to a liquid phase. The container 14 may form a portion of the immersion tank 12. The two-phase immersion cooling system 10 also comprises a plurality of circuit boards 22 (only one is shown in FIG. 1). For example, the circuit boards 22 can be programmed for blockchain mining operation. The circuit boards 22 are sized to be lowered into the container 14, preferably so that the circuit boards 22 can be entirely immersed into the bath of dielectric heat transfer fluid in liquid phase. For example, the circuit boards 22 can be held in modular cases 34, and the modular cases 34 can be at least partially lowered into the container 14, while an upper portion of the modular cases 34 may emerge from the bath of dielectric heat transfer fluid in liquid phase. Non-limiting examples of immersion tanks that may be used are described in U.S. patent application Ser. No. 15/983,739, filed on May 18, 2018, and Ser. No. 16/019,252, filed on Jun. 26, 2018, which are included herein by reference.

The system 10 comprises a plurality of voltage converters 18 mounted on a skid 20, on which the immersion tank 12 can also bemounted. For example, the voltage converters 18 may be placed in shelves. The voltage converters 18 are designed for converting a high voltage (e.g., 415 volts, 3-phases, Alternating Current), low amperage current into a low voltage (e.g., 12 volts, Direct Current), high amperage current. In order to reduce the volume of the bath of dielectric heat transfer fluid in liquid phase, the voltage converters 18 are preferably mounted outside the immersion tank 12.

In order to pass the high amperage current from the voltage converters 18 to the circuit boards 22, the system 10 comprises a plurality of busbars 24 (only one complete busbar 24 is shown in FIG. 1). The busbars 24 extend through a wall 26 of the immersion tank 12. For example, the busbars 24 include an inner portion 28 extending inside the immersion tank 12, and an outer portion 30 extending outside the immersion tank 12. Each busbar 24 is electrically connected to at least one voltage converter 18. Each busbar 24 is also electrically connected to at least one circuit board 22. The busbars 24 can be made essentially of copper. Aluminum, or a combination of copper and aluminum may be used instead of copper. The busbars 24 can be at least partially plated. For example, a portion of each busbar 24 that is located outside of the immersion tank 12 can be plated with silver to avoid corrosion the portion. Other noble metals or alloys can be used for plating.

Figure 2:
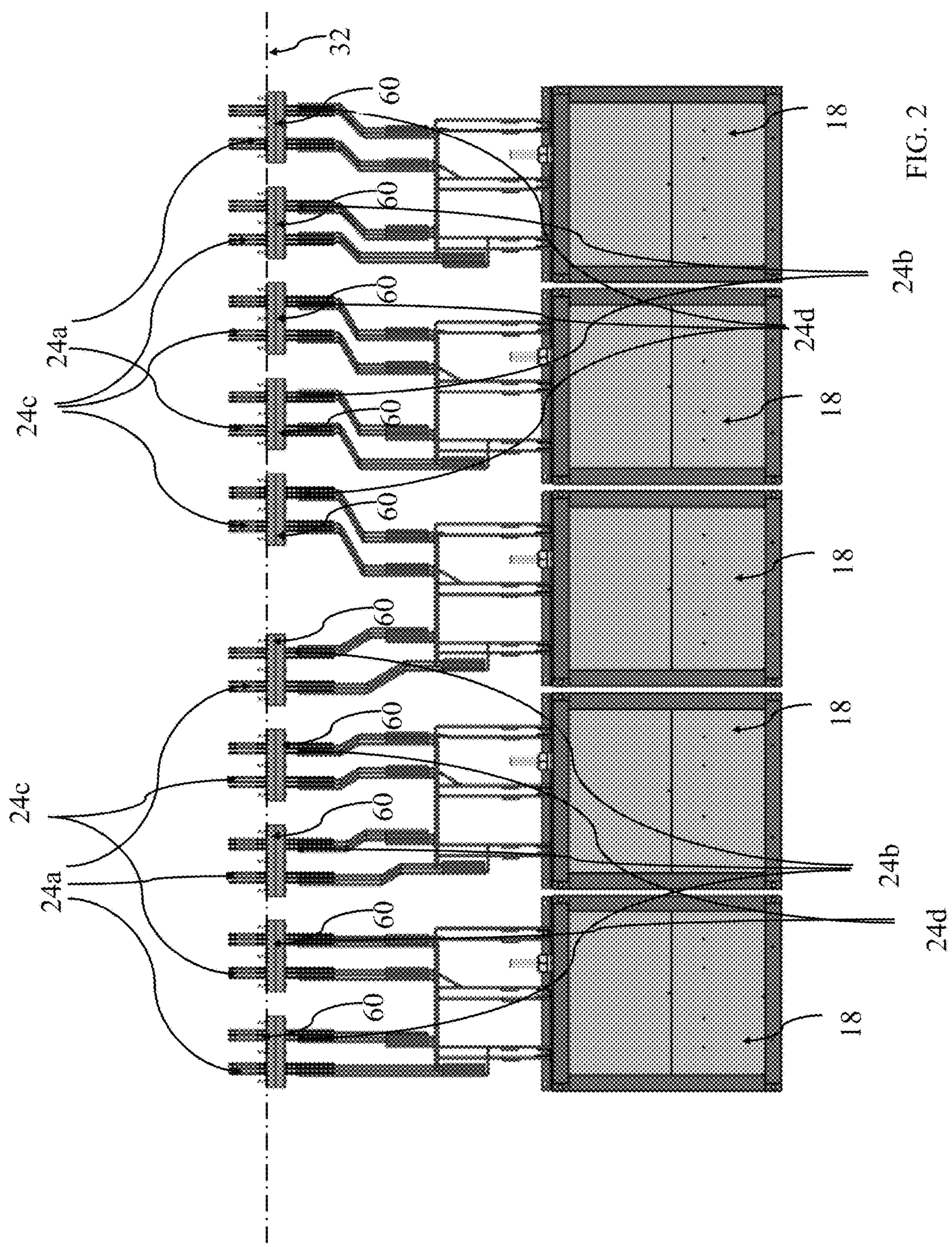
FIG. 2 is a top view of a portion of the system shown in FIG. 1 illustrating the voltage converters and the plurality of busbars connected to the voltage converters.

FIG. 2 illustrates the example configuration of the busbars 24 and the voltage converters 18 shown in FIG. 1, wherein, for the sake of clarity, FIG. 2 does not show the immersion tank 12, but the wall 26 is shown in ghost line. In the embodiment shown in FIG. 2, 40 voltage converters 18 are placed in shelves having 4 rows and 5 columns, each of which may provide 25 kilowatts of electric power. The voltage converters 18 have 3 pairs of terminals, each pair having a positive terminal and a negative (or ground) terminal. In each column, the 3 positive terminals of the top voltage converter 18 and the 3 positive terminals of the voltage converter 18 located immediately below the top voltage converter 18 are connected in parallel to a single busbar (one of the busbars 24*a*). The 3 negative terminals of the top voltage converter 18 and the 3 negative terminals of the voltage converter 18 located immediately below the top voltage converter 18 are also connected in parallel to a single busbar (one of the busbars 24*b*). Similarly, the 3 positive terminals of the bottom voltage converter 18 and the 3 positive terminals of the voltage converter 18 located immediately above the bottom voltage converter 18 are connected in parallel to a single busbar (one of the busbars 24*c*). The 3 negative terminals of the bottom voltage converter 18 and the 3 negative terminals of the voltage converter 18 located immediately above the bottom voltage converter 18 are also connected in parallel to a single busbar (one of the busbars 24*d*). Other configurations of the busbars 24 and the voltage converters 18 are also possible, as can be appreciated by as a person of ordinary skill in the art who has been given the benefit of the disclosure.

Figure 3:
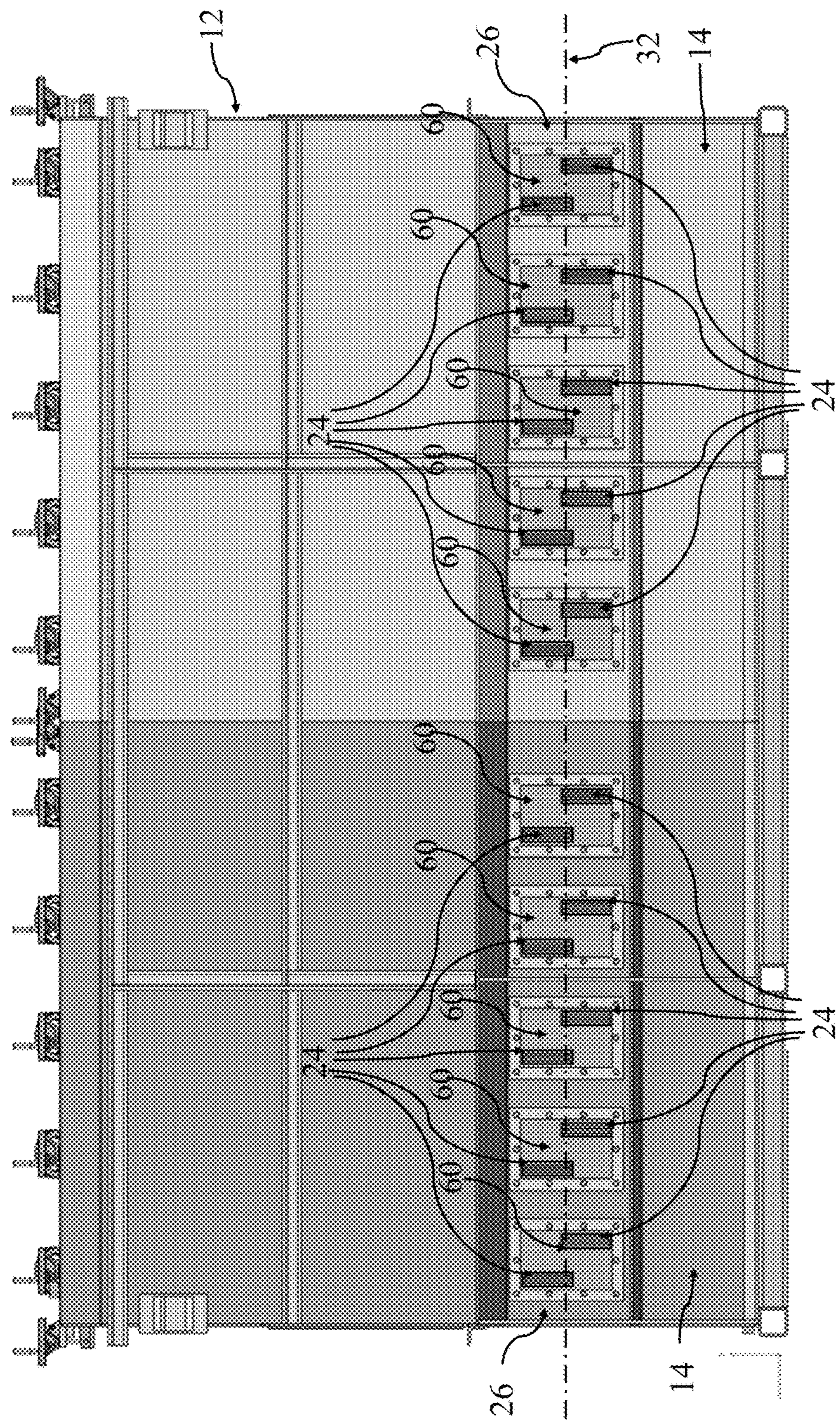
FIG. 3 is a side view of a portion of the system shown in FIG. 1 illustrating the immersion tank and the plurality of busbars extending through a wall of the immersion tank.

FIG. 3 further illustrates the example configuration of the busbars 24 and the immersion tank 12 shown in FIG. 1, wherein, for the sake of clarity, FIG. 3 does not show the voltage converter 18. The busbars 24 are preferably distributed over a horizontal direction 32 of the wall 26 of the immersion tank 12. In other words, the busbars 24 preferably span a substantial portion of the wall 26 along the horizontal direction 32. Further, the busbars 24 are optionally, but not necessarily, located alternately at approximately equal distances above and below the horizontal direction 32. Still further, sets of busbars 24 located above the horizontal direction 32 are optionally, but not necessarily, approximately evenly spaced over the horizontal direction 32 of the wall 26. Similarly, sets of busbars 24 located below the horizontal direction 32 are optionally, but not necessarily, approximately evenly spaced over the horizontal direction 32 of the wall 26.

Figure 4:
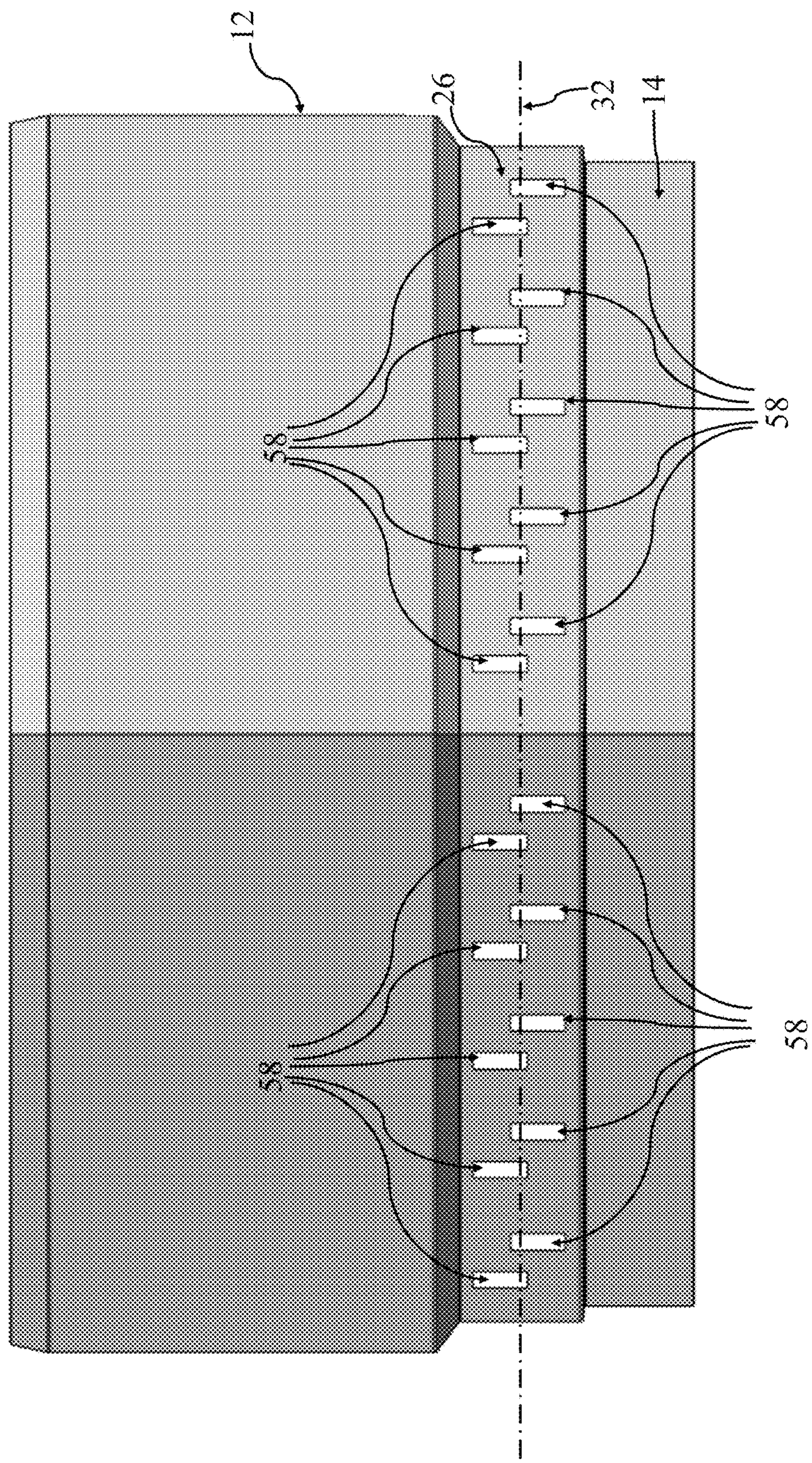
FIG. 4 is a side view of a portion of the system shown in FIG. 1 illustrating only the immersion tank traversed by apertures.

FIG. 4 illustrates the side of the immersion tank 12 shown in FIG. 1. In order to allow for the busbars 24 to extend through the wall 26 of the immersion tank 12, one or more apertures 58 traverse the wall 26. Between 10 and 20 apertures 58 may traverse through the wall 26 of the immersion tank 12 (the embodiment shown in FIG. 4 comprises 20 apertures 58).

Referring to FIGS. 2, 3 and 4, the busbars 24 (not shown in FIG. 4) extend through one of the apertures 58. The busbars 24 extending through one aperture can be designed to carry between 1,000 and 4,200 Amperes, and preferably between 2,100 and 4,200 Amperes. The system 10 further comprises a means for preventing leakage of dielectric fluid around the busbars 24, such as one or more sealing lids 60 (not shown in FIG. 4). The sealing lids 60 cover at least one of the apertures 58 (the sealing lids 60 shown in FIG. 3 cover two apertures 58). The busbars 24 extend through the sealing lids 60.

Figure 5A:
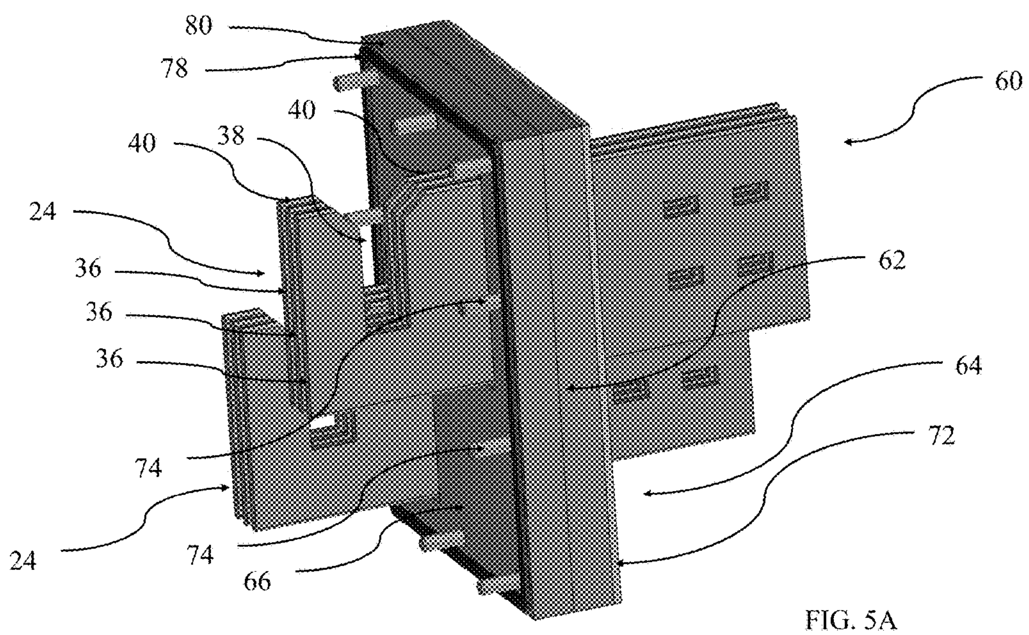
FIG. 5A is a perspective view illustrating a sealing lid for preventing leakage of dielectric fluid around the busbars.
Figure 5B:
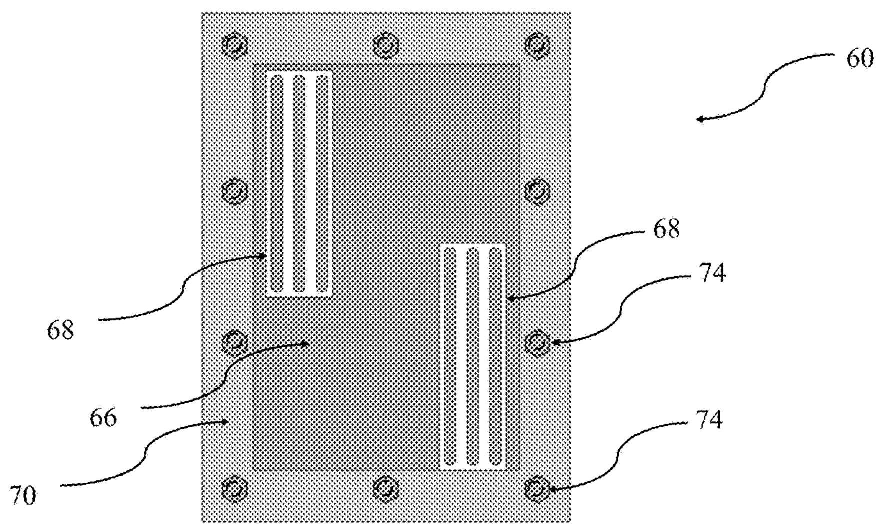
FIG. 5B is a side view of the sealing lid shown in FIG. 5A.

Referring to FIGS. 5A and 5B, the sealing lids 60 comprise a body 62, for example, made of fiberglass reinforced plastic. The body 62 has a first face 64 and a second face 66, which may be essentially parallel to the first face 64. The body 62 includes one or more body apertures 68 (the sealing lids 60 shown in FIGS. 2, 3, 5A, and 5B include two body apertures 68). The busbars 24 extend through the body apertures 68. The body apertures 68 may be potted with a resin-based polymer. The sealing lids 60 comprise a frame 70, for example, made of metal. The frame 70 is disposed along a first boundary 72 of the first face 64 of the body 62. The sealing lids 60 comprise a plurality of bolts 74. The bolts 74 are located in holes 76 (shown in ghost lines) traversing the body 62 and the frame 70. The holes 76 may be potted with a resin-based polymer. The sealing lids 60 comprise a sealing gasket 78. The sealing gasket 78 is disposed along a second boundary 80 of the second face 66. The sealing gasket 78 further surrounds the bolts 74 and the body apertures 68.

Figure 6:
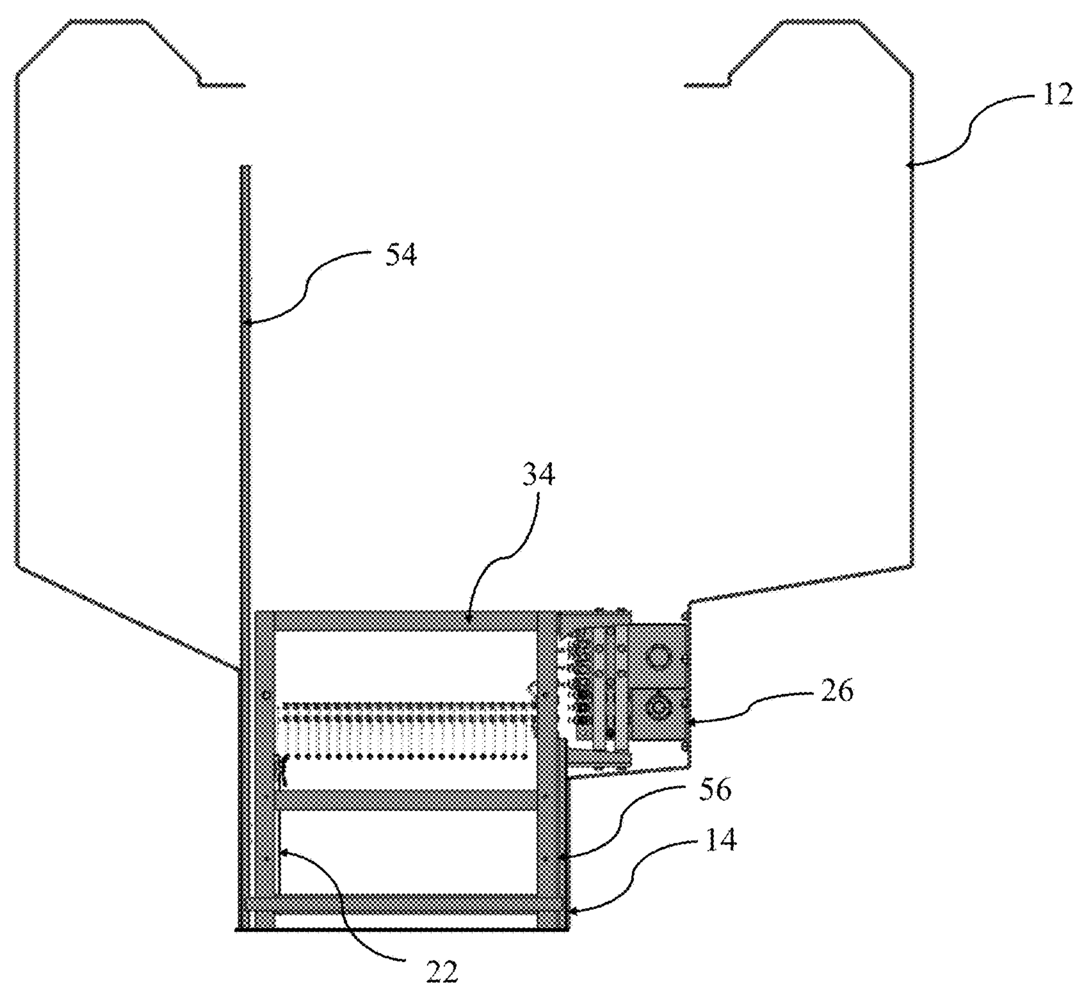
FIG. 6 is a top view of a portion of the system shown in FIG. 1 illustrating modular cases holding circuit boards at least partially lowered a bath of dielectric heat transfer fluid in liquid phase.

FIG. 6 illustrates an example configuration of modular cases 34 disposed in the immersion tank 12, wherein, for the sake of clarity, FIG. 6 does not show busbars 24 and the voltage converters 18. In order to easily access the circuit boards 22 (only one circuit board is illustrated in FIG. 6), for example during installation or maintenance operation, the system 10 comprises modular cases 34 holding the circuit boards 22. The modular cases 34 are sized to be at least partially lowered into the container 14, which, in use, may be filled with a dielectric fluid in liquid phase. For example, a set of vertical rails 54, 56, secured to the immersion tank 12, can allow suitable guidance and alignment of the modular cases 34 with the inner portions 28 of the busbars 24 (shown in FIG. 1).

Figure 7A:
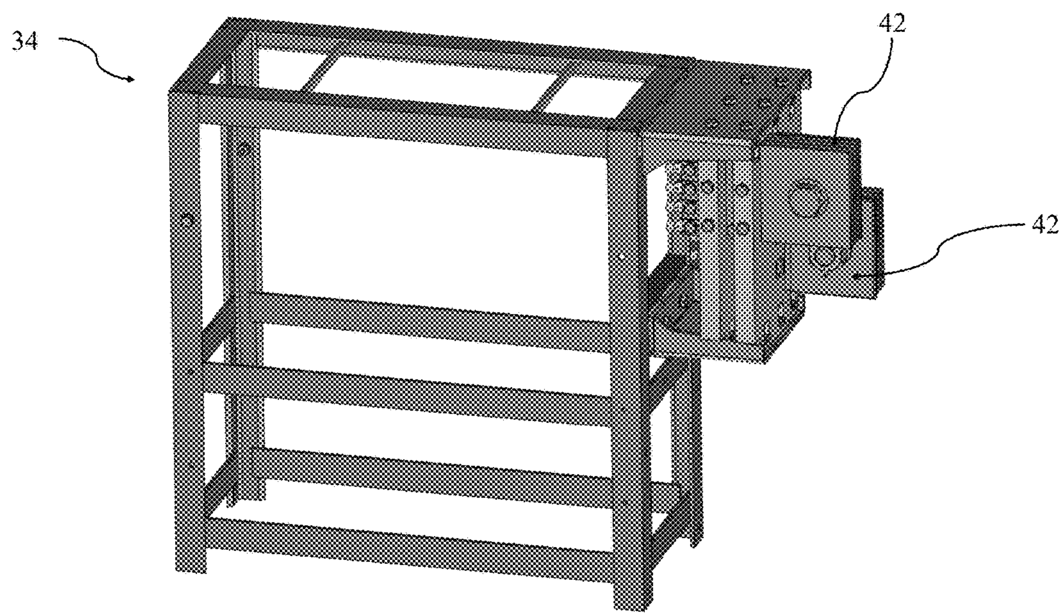
FIG. 7A is a perspective view of a modular case shown in FIG. 6 illustrating connections plates for establishing an electrical connection upon insertion of the modular case into the immersion tank.
Figure 7B:
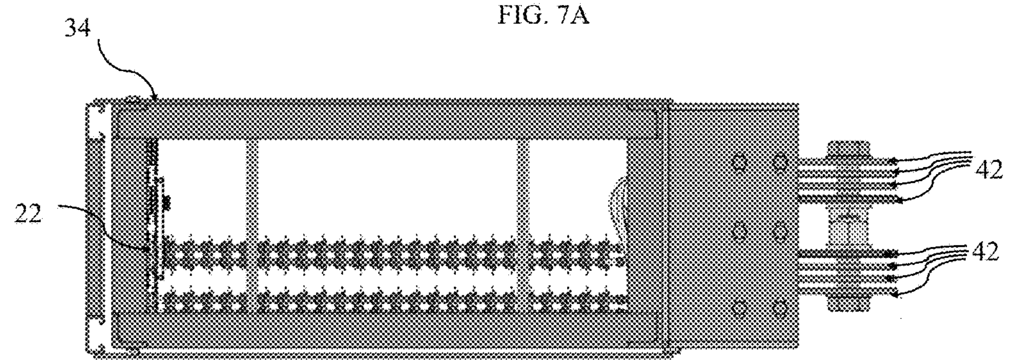
FIG. 7B is a top view of the modular case shown in FIG. 7A.

Referring to FIGS. 7A and 7B, the system 10 comprises means for connecting the busbars 24 to connectors plates 42 secured to the modular cases 34. Two or more connector plates 42 are secured to the modular cases 34. The connector plates 42 may be spaced such that each busbar 24 plate is capable of sliding between two connector plates 42. As such, the modular cases 34 can be vertically inserted in the immersion tank 12, and electrical connections between the circuit boards 22 held in the modular cases 34 and the busbars 24 (shown in FIG. 1) extending through the wall 26 of the immersion tank 12 can be established. The circuit boards 22 (only shown in FIG. 7B) can thus be powered by the voltage converters 18 (shown in FIG. 1) via the busbars 24.

Referring back to FIG. 5A, the inner portion 28 of the busbars 24 comprises one or more busbar plates 36 (3 busbar plates 36 form one busbar 24 in the example of FIG. 5A). The busbar plates 36 have a notch 38 extending downward from an upper outer surface 40 of the busbar plates 36.

Figure 8A:
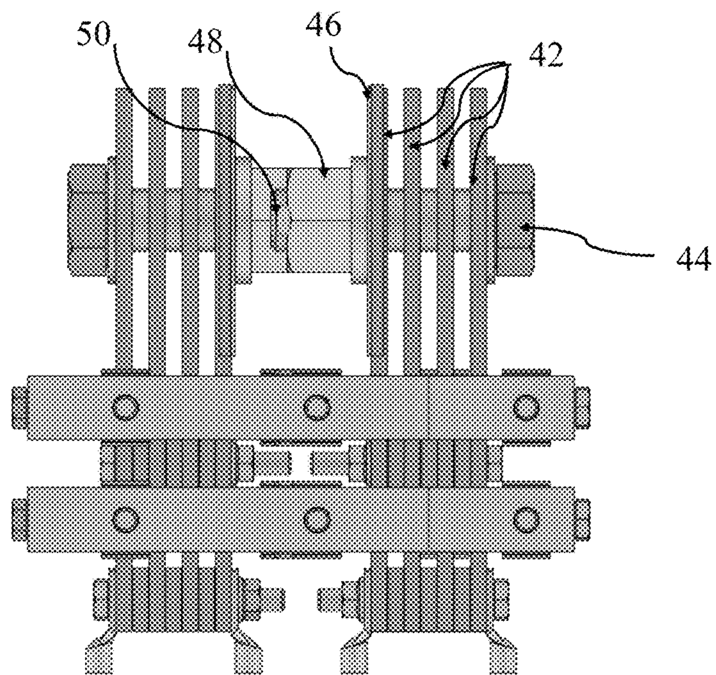
FIGS. 8A, 8B, and 8C are a top view, a side view, and a perspective view of an assembly traversing the connections plates shown in FIGS. 7A and 7B for connecting the busbars to the connectors plates.
Figure 8B:
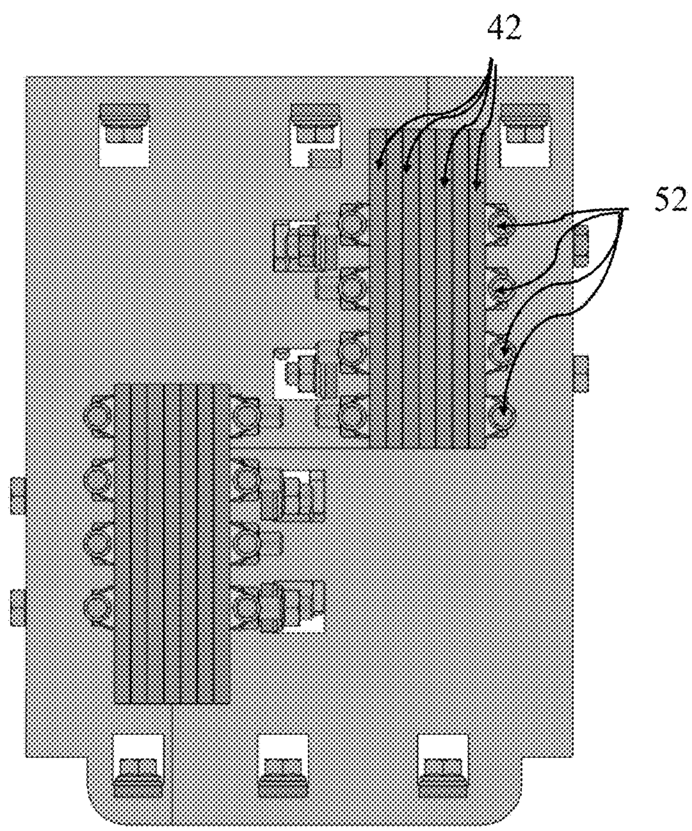
Figure 8C:
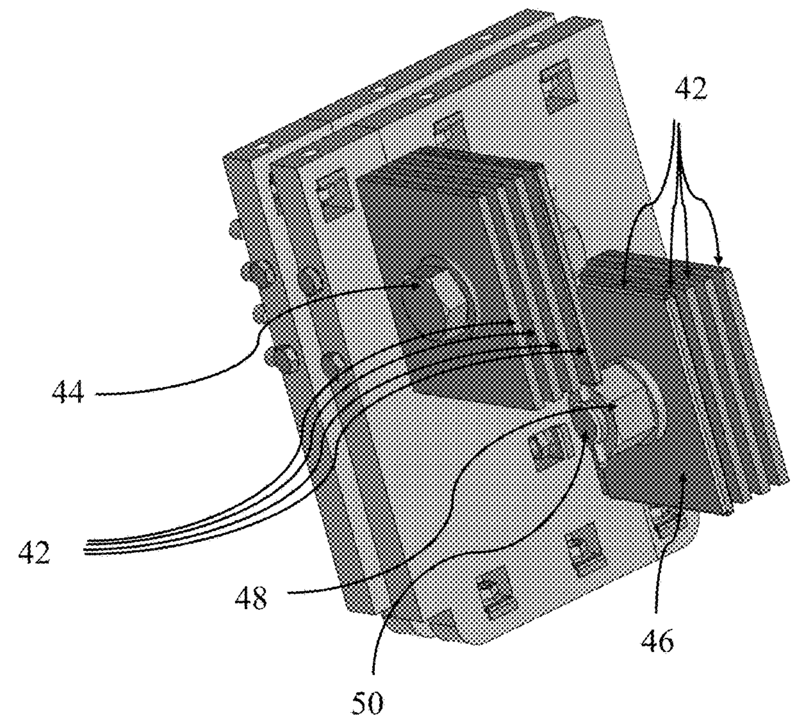

Turning to FIGS. 8A, 8B, and 8C, an assembly for connecting the busbars 24 (shown in FIG. 5A) to the connectors plates 42 is illustrated, wherein, for the sake of clarity, FIGS. 8A, 8B, and 8C do not show the modular cases 34. A bolt 44 traverses the connector plates 42. The bolt 44 are sized to slide into the notches 38 of the busbar plates 36. An optional load distribution plate 46 is traversed by the bolt 44. A nut 48 can be threaded on an end portion 50 of the bolt 44. A plurality of sockets 52 (or lugs) are electrically connected to the connector plates 42. The sockets 52 are then connected to the circuit boards 22 via wire harnesses. Upon tightening the nut 48 by approximately ¼ of a turn, electrical contact can be established between the connector plates 42 and the busbar plates 36.

Conversely, the bolt may be held by the busbar plates and may slide into notches provided in the connection. Accordingly, the inner portion may comprise two or more busbar plates. A bolt may traverse the busbar plates. A load distribution plate may be traversed by the bolt. A nut may be threaded on an end portion of the bolt. One or more connector plates may be secured to the modular cases. The connector plates may be sized such that each connector plate is capable of sliding between two busbar plates. The connector plates may have a notch extending upward from a lower outer surface of the connector plates. The bolt may be sized to slide into the notches of the connector plates. Again, a plurality of sockets may be electrically connected to the connector plates.

Figure 9:
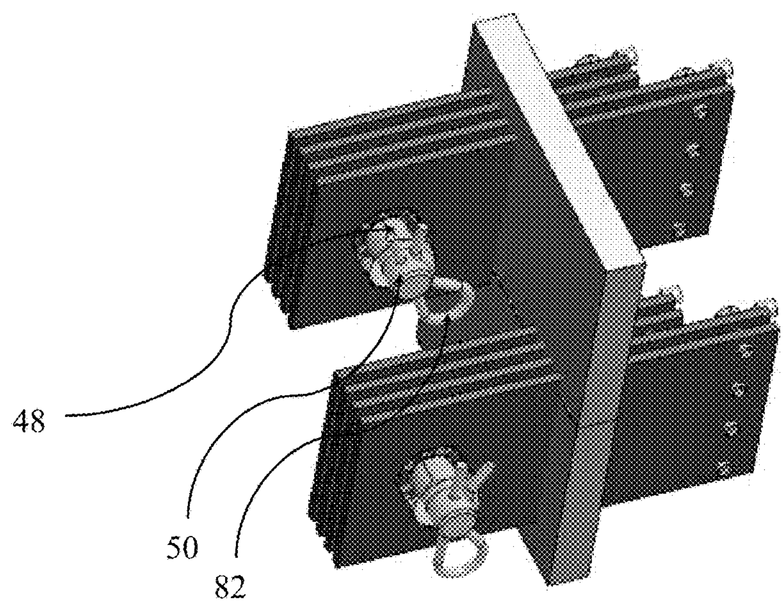
FIG. 9 is a perspective view of an assembly for connecting the busbars to the connectors plates.

In the alternative of assembly for connecting the busbars 24 shown in FIG. 9, a retention pin 82 is optionally provided at the end portion 50 of the bolt 44, to avoid dropping of the nut 48.

While the disclosure is susceptible to various modifications and alternative forms, specific embodiments thereof are shown by way of example in the drawings and description. It should be understood, however, that the drawings and detailed description thereto are not intended to limit the claims to the particular form disclosed, but on the contrary, the intention is to cover all modifications, equivalents, and alternatives falling within the scope of the claims.

What is claimed is:

1. A two-phase immersion cooling system, comprising:

an immersion tank including a container for holding a bath of dielectric heat transfer fluid in liquid phase and at least one condenser for condensing dielectric heat transfer fluid from a vapor phase to a liquid phase;

a plurality of busbars, each busbar extending through a wall of the immersion tank, each busbar including an inner portion extending inside the immersion tank and an outer portion extending outside the immersion tank, wherein the busbars are distributed over a horizontal direction of the wall of the immersion tank;

one or more apertures traversing through the wall of the immersion tank; and one or more sealing lids, each sealing lid covering at least one of the apertures, wherein each busbar extends through one of the sealing lids and through one of the apertures, and wherein each lid comprises:

a body made of fiberglass reinforced plastic having a first face and a second face essentially parallel to the first face, the body including one or more body apertures, at least one of the busbars extending through each body aperture, and each body aperture being potted with a resin-based polymer;

a metallic frame disposed along a boundary of the first face of the body;

a plurality of bolts each located in a hole traversing the body and the metallic frame, wherein each hole is potted with a resin-based polymer; and a sealing gasket disposed along a boundary of the second face, surrounding the bolts, and surrounding the body apertures.

2. The two-phase immersion cooling system of claim 1, wherein the wall of the immersion tank comprises a lateral wall located above the container, such that, in use, each busbar is located above the bath of dielectric heat transfer fluid in liquid phase.

3. The two-phase immersion cooling system of claim 1, wherein each busbar is essentially made of copper, aluminum, or a combination of copper and aluminum.

4. The two-phase immersion cooling system of claim 3, wherein each busbar is at least partially plated.

5. The two-phase immersion cooling system of claim 1, wherein the busbars extending through one of the apertures are designed to carry between 1,000 and 4,200 Amperes.

6. The two-phase immersion cooling system of claim 5, comprising between 10 and 20 apertures traversing through the wall of the immersion tank.

7. A two-phase immersion cooling system, comprising:

an immersion tank including a container for holding a bath of dielectric heat transfer fluid in liquid phase and at least one condenser for condensing dielectric heat transfer fluid from a vapor phase to a liquid phase;

a plurality of busbars, each busbar extending through a wall of the immersion tank, each busbar including an inner portion extending inside the immersion tank and an outer portion extending outside the immersion tank, wherein the busbars are distributed over a horizontal direction of the wall of the immersion tank, and wherein the inner portion comprises one or more busbar plates, each busbar plate having a notch extending downward from an upper outer surface of the busbar plate;

two or more connector plates;

a bolt traversing the connector plates and sized to slide into the notch of each busbar plate; and a nut threaded on an end portion of the bolt.

8. The two-phase immersion cooling system of claim 7, further comprising:

a load distribution plate traversed by the bolt.

9. The two-phase immersion cooling system of claim 7, further comprising:

a modular case holding at least one circuit board, wherein the modular case is sized to be at least partially lowered into the container for holding the bath of dielectric heat transfer fluid in liquid phase, wherein the connector plates are secured to the modular case, and wherein the connector plates are spaced such that each busbar plate is capable of sliding between two connector plates.

10. The two-phase immersion cooling system of claim 7, further comprising a plurality of sockets electrically connected to the connector plates.

11. A two-phase immersion cooling system, comprising:

an immersion tank including a container for holding a bath of dielectric heat transfer fluid in liquid phase and at least one condenser for condensing dielectric heat transfer fluid from a vapor phase to a liquid phase;

a plurality of busbars, each busbar extending through a wall of the immersion tank, each busbar including an inner portion extending inside the immersion tank and an outer portion extending outside the immersion tank, wherein the busbars are distributed over a horizontal direction of the wall of the immersion tank, and wherein the inner portion comprises two or more busbar plates;

one or more connector plates, wherein the connector plates are sized such that each connector plate is capable of sliding between two busbar plates, each connector plate having a notch extending upward from a lower outer surface of the connector plate;

a bolt traversing the busbar plates and sized to slide into the notch of each connector plate; and a nut threaded on an end portion of the bolt.

12. The two-phase immersion cooling system of claim 11, further comprising:

a load distribution plate traversed by the bolt.

13. The two-phase immersion cooling system of claim 11, further comprising:

a modular case configured for holding at least one circuit board, wherein the modular case is sized to be at least partially lowered into the container for holding the bath of dielectric heat transfer fluid in liquid phase, wherein the connector plates are secured to the modular case.

14. A two-phase immersion cooling system, comprising:

an immersion tank including a container for holding a bath of dielectric heat transfer fluid in liquid phase and at least one condenser for condensing dielectric heat transfer fluid from a vapor phase to a liquid phase;

a plurality of busbars, each busbar extending through a wall of the immersion tank, each busbar including an inner portion extending inside the immersion tank and an outer portion extending outside the immersion tank, wherein the busbars are distributed over a horizontal direction of the wall of the immersion tank;

a skid, wherein the immersion tank is mounted on the skid; and a plurality of voltage converters mounted on the skid outside the immersion tank, each voltage converter being designed for converting a high voltage, low amperage current into a low voltage, high amperage current, wherein each busbar is electrically connected to at least one of the voltage converters.

15. The two-phase immersion cooling system of claim 14, further comprising:

a plurality of circuit boards, each circuit board being sized to be at least partially lowered into the container for holding the bath of dielectric heat transfer fluid in liquid phase, wherein each busbar is electrically connected to at least one of the circuit boards.

16. The two-phase immersion cooling system of claim 15, wherein at least one of the circuit boards is programmed for blockchain mining operation.

* * * * *